(12) United States Patent
Iguchi et al.

(10) Patent No.: US 9,123,605 B2
(45) Date of Patent: Sep. 1, 2015

(54) IMAGE SENSOR

(71) Applicant: SUMITOMO ELECTRIC INDUSTRIES, LTD., Osaka-shi, Osaka (JP)

(72) Inventors: Yasuhiro Iguchi, Yokohama (JP); Hiroshi Inada, Sakai (JP); Masaki Migita, Fujisawa (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/296,891

(22) Filed: Jun. 5, 2014

(65) Prior Publication Data

US 2014/0367818 A1 Dec. 18, 2014

(30) Foreign Application Priority Data

Jun. 12, 2013 (JP) .................................. 2013-123852

(51) Int. Cl.
*H01L 27/146* (2006.01)
(52) U.S. Cl.
CPC .... *H01L 27/14623* (2013.01); *H01L 27/14618* (2013.01); *H01L 27/14694* (2013.01)
(58) Field of Classification Search
CPC ............... H01L 2224/48091; H01L 27/14634; H01L 27/14618; H01L 31/0203; H01L 27/14636; H01L 27/1469; H01L 2224/48145; H01L 27/14601; H01L 27/14625; H01L 31/0232; H01L 27/14623

USPC ......... 257/226, 233–234, 229, 431–444, 737; 438/118, 125, 15, 72
See application file for complete search history.

(56) References Cited

U.S. PATENT DOCUMENTS

| | | | | |
|---|---|---|---|---|
| 6,075,237 A | * | 6/2000 | Ciccarelli | 250/208.1 |
| 7,382,057 B2 | * | 6/2008 | Hsu | 257/778 |
| 7,525,127 B2 | * | 4/2009 | Hattori et al. | 257/99 |
| 2003/0201535 A1 | * | 10/2003 | Chen et al. | 257/738 |
| 2004/0165098 A1 | * | 8/2004 | Ikeda | 348/340 |

FOREIGN PATENT DOCUMENTS

JP 2013-041922 2/2013

OTHER PUBLICATIONS

Yasuhiro Iguchi et al., "*Two-Dimensional Near Infrared Sensor with Low Noise and Wide Wavelength Range*", SEI Technical Review, No. 76, pp. 98-101, Apr. 2013.

* cited by examiner

*Primary Examiner* — Yasser A Abdelaziez
*Assistant Examiner* — Farun Lu
(74) *Attorney, Agent, or Firm* — Smith, Gambrell & Russell LLP

(57) ABSTRACT

An image sensor includes a package having a window; a sensor chip facing the window, the sensor chip having a pixel region, the sensor chip having an electrode; a read-out circuit disposed farther from the window than the sensor chip, the read-out circuit having a read-out electrode connected to the electrode of the sensor chip; and a shielding plate disposed outside the pixel region of the sensor chip. The shielding plate is configured to block transmission of light.

13 Claims, 7 Drawing Sheets

IMAGE SENSOR

BACKGROUND OF THE INVENTION

1. Field of the Invention

The present invention relates to an image sensor.

2. Description of the Related Art

Life science-related objects, such as drugs, foods, and living bodies, absorb light of an infrared wavelength range of approximately 1 μm to 3 μm. As the technology in the life science field is developed, the demand for infrared image sensors also increases in the life science field. The infrared image sensors are usually Cooled to, for example, liquid-nitrogen temperature during operation. With improvements in semiconductor technology, infrared image sensors have sufficiently high image quality, even if the infrared image sensors are cooled by using thermoelectric device such as a Peltier device. In addition, the infrared image sensors have become smaller in size. For example, "Two-Dimensional Near Infrared Sensor with Low Noise and Wide Wavelength Range", SEI TECHNICAL REVIEW, NUMBER 76, pp. 98-101, APRIL (2013) by Yasuhiro IGUCHI et al. discloses an infrared image sensor that combines an infrared light receiving device (sensor chip) having a two-dimensional array of pixels with a complementary metal oxide semiconductor (CMOS) device forming a read-out circuit (read-out integrated circuit (ROIC)). In this infrared image sensor, the sensor chip is flip-chip connected via indium bumps to the CMOS device. This sensor chip is mounted on a ceramic package together with a Peltier device. A photocurrent generated in each pixel of the sensor chip is output as a voltage via a capacitive trans-impedance amplifier (CTIA) in the read-out circuit, processed by an external field-programmable gate array (FPGA), and then output as a digital signal.

Japanese Unexamined Patent Application Publication No. 2013-41922 describes a problem related to image quality of an infrared image sensor. In this problem, alight receiving device malfunctions due to infrared light entering through through-holes passing through a wiring board. As a solution to this, a light receiving apparatus is proposed, in which the through-holes are filled with resin that transmits visible light and blocks infrared light.

SUMMARY OF THE INVENTION

The infrared image sensor is contained in a package having a window. In the infrared image sensor, high performances such as a low dark current and a high-resolution image are obtained by cooling the infrared image sensor using, for example, a Peltier device. It is found that the image sensor of this type has phenomena (problems) that deteriorate image quality. For example, when white light of a halogen lamp is applied to a flat plate and the reflected light is made incident on the infrared image sensor, an image with a uniform intensity distribution over the entire screen should be obtained. In practice, however, a band-like light portion and dark portions by which the band-like light portion is sandwiched from above and below appear on the screen of the image sensor. Additionally, a region with undulations of light and dark appears in part of the screen of the image sensor. Such phenomena seriously degrade the image quality and damage the commercial value of the infrared image sensor.

An image sensor according to the present invention includes a package having a window; a sensor chip facing the window, the sensor chip having a pixel region, the sensor chip having an electrode; a read-out circuit disposed farther from the window than the sensor chip, the read-out circuit having a read-out electrode connected to the electrode of the sensor chip; and a shielding plate disposed outside the pixel region of the sensor chip. The shielding plate is configured to block transmission of light. The shielding plate is preferably extended to an outside of the read-out circuit in plan view.

In the image sensor according to the present invention, the read-out circuit has an area extending off the sensor chip in plan view, and the shielding plate that blocks light is disposed between this extending area and the window. The shielding plate may extend to an outside of the read-out circuit in plan view. Therefore, light from the window does not reach the extending area of the read-out circuit and that of a relay board because the light is shielded with the shielding plate. As a result, there is no light that is reflected from the extending areas. Therefore, there is no light that is reflected from the back surface of the window and then reaches the sensor chip. It is thus possible to prevent an uneven distribution of light and dark in an image, prevent undulations of light and dark, and obtain high-quality images.

In the image sensor according to the present invention, the shielding plate may be inclined to reflect light entering through the window in a direction away from the sensor chip. This can prevent light from reflecting off the shielding plate toward the center of the sensor chip. Therefore, there is no light that is reflected from the back surface of the window and then enters the effective pixel region of the sensor chip.

In the image sensor according to the present invention, the shielding plate is preferably inclined to be closer to a bottom of the package with increasing distance from the sensor chip, the bottom of the package being located at the opposite side of the window.

In the image sensor according to the present invention, the shielding plate may be secured to an edge of the sensor chip. Thus, even when the image sensor includes bonding wires connected to pad electrodes of, for example, the read-out circuit, the shielding plate may be easily positioned in a roof like manner after the process of wire bonding connection. The shielding plate is provided along the entire perimeter of the rectangular sensor chip.

The image sensor according to the present invention may further include a relay board disposed under the read-out circuit. The read-out circuit may include a pad electrode at an area extending off the sensor chip. The relay board may include an interconnection electrode at an area extending off the sensor chip. In addition, the shielding plate may be secured to an edge of the read-out circuit or an edge of the relay board.

In the image sensor according to the present invention, the shielding plate may be made of aluminum nitride (AlN). Since AlN has high thermal conductivity and good heat dispersion properties, using AlN for the shielding plate is effective in maintaining the interior of the package at a low temperature.

The image sensor according to the present invention may further include a bump connecting the electrode of the sensor chip to the read-out electrode of the read-out circuit, and an underfill resin filling a space between the bumps. The shielding plate may be secured by means of a resin serving as a fixing agent. In addition, the resin may be made of the same material as that of the underfill resin.

The read-out circuit (silicon) and the sensor chip (compound semiconductor) have thermal expansion coefficients different from each other. In the image sensor according to the present invention, the shielding plate is secured by means of the same resin as the underfill resin to the edge of the sensor chip. In this case, the resin having the same thermal expansion coefficient is applied to both the front and back surfaces of the sensor chip. Therefore, the thermal stress between the front and back surfaces of the sensor chip can be reduced.

DESCRIPTION OF THE PREFERRED EMBODIMENTS

Figure 1:
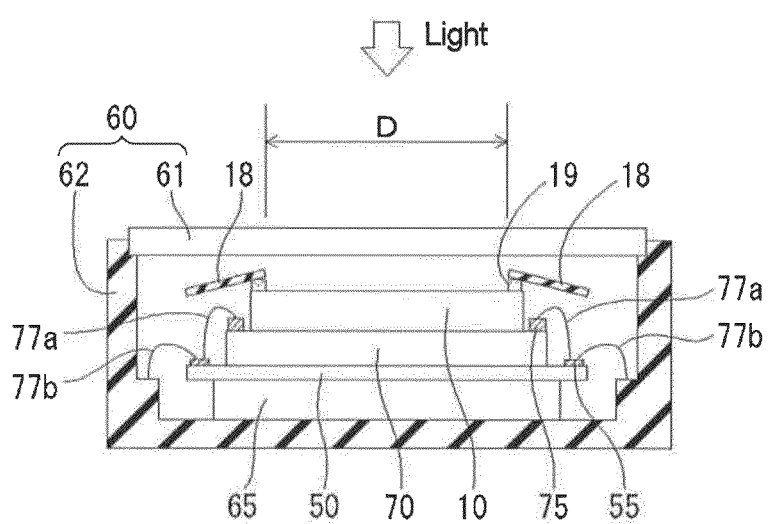
FIG. 1 illustrates an image sensor according to a first embodiment of the present invention.

Embodiments of an image sensor according to the present invention will be described with reference to the attached drawings. Where possible, the same parts are given the same reference numerals.

An image sensor includes a package having a window. A bottom of the package is located at the opposite side of the window. In the following description, a window side of the package may be referred to as an upper side, and a bottom side of the package may be referred to as a bottom side or a lower side.

An incidence surface of a sensor chip or light receiving device faces the window of the package. Read-out electrodes are disposed under the sensor chip and a relay board is disposed under the read-out electrodes. The relay board is disposed on a Peltier device. The Peltier device is disposed on the bottom of the package. A package main body of the package is made of sintered ceramic for heat insulation. That is, the image sensor includes the sensor chip (light receiving device), a read-out circuit, the relay board, and the Peltier device that are disposed in this order from the upper side in the package. Pixel electrodes of the sensor chip (light receiving device) are flip-chip connected via bumps to read-out electrodes of the read-out circuit.

Read-out signals are taken out from pad electrodes on the read-out circuit. One end of a wire is connected by wire bonding to each pad electrode on the read-out circuit, and the other end of this wire is connected to a part of each interconnection electrode on the relay board. One end of another wire is connected to the remaining part of the interconnection electrode, and the other end of this wire is connected to a connecting pin formed in the package main body. For the wire bonding connection described above, the pad electrodes on the read-out circuit need to be arranged in an area extending of the sensor chip in plan view. In other words, for arrangement of the pad electrodes, the read-out circuit needs to have an area extending off the sensor chip. For arrangement of the interconnection electrodes, the relay board also needs to have an area extending off the read-out circuit in plan view.

However, it has been found that the following phenomena occur in the image sensor. To evaluate the image sensor, white light of a halogen lamp is applied to a flat plate and the reflected light is made incident on the infrared image sensor. In this case, an image with a uniform intensity distribution over the entire rectangular screen should be obtained. However, in practice, a band-like light portion and dark portions which sandwich the band-like light portion appear in a direction parallel to horizontal sides (long sides) of the rectangular screen. Additionally, undulations of light and dark appear at edge portions along vertical sides (short sides) of the rectangular screen. Such phenomena seriously degrade the image quality and damage the commercial value of the infrared image sensor.

Causes of the phenomena have been examined. Most of light entering through the window is incident on an effective pixel region of the sensor chip. The window is sized to be larger than the incidence surface of the sensor chip to allow more space. Therefore, light entering through the window passes outside the sensor chip and reaches the pad electrodes on the read-out circuit and the surrounding portions. Then, the light is reflected from the pad electrodes on the read-out circuit and the surrounding portions, and reaches the back surface of the window. The light further is reflected from the back surface of the window and returns to the sensor chip. The light reflected from the pad electrodes on the read-out circuit is likely to correspond to band-like dark and light portions parallel to the long sides of the rectangular screen described above. Undulations of light and dark appearing at edge portions along the short sides of the rectangular screen are likely to be caused by light reflected from the short sides of the read-out circuit and the corresponding portions of the relay board, or by interference of such light beams.

In the embodiment, an image sensor includes a package having a window. The package contains a sensor chip facing the window, a read-out circuit disposed farther from the window than the sensor chip and having electrodes connected to electrodes of the sensor chip, and a shielding plate disposed along an edge of the sensor chip. The shielding plate is configured to block transmission of light. The edge of the sensor chip refers to an edge portion outside an effective pixel region. The image sensor is applicable not only to infrared image sensors but also to image sensors for other wavelength regions, as long as they each include a package having a window.

Specific exemplary embodiments will now be described with reference to the drawings. Note that the invention of the present application is not limited to such exemplary embodiments. The invention is defined by the appended claims, and is intended to encompass meanings equivalent to the claims and all changes within the scope of the invention.

First Embodiment

FIG. 1 is a schematic view of an infrared image sensor 90 according to a first embodiment. In the infrared image sensor 90 illustrated in FIG. 1, a sensor chip 10, a read-out circuit 70, a relay board 50, and a Peltier device 65 are contained in a package 60. The package 60 is made by combining a window 61 with a box-like package main body 62. Since the package 60 may be cooled to a low temperature by using the Peltier device 65 and subjected to a negative pressure, an inert gas, such as nitrogen gas or argon gas, may be sealed in the package 60. A surface of the sensor chip 10 facing the window 61 (typically a back surface of a substrate) is provided with an antireflection coating (AR coating). The sensor chip 10 may be of any type. For example, the sensor chip 10 may include a type-II InGaAs/GaAsSb multi quantum well (MQW) structure formed on an InP substrate as an optical absorption layer, so as to have a sensitivity even in a near-infrared long wavelength region (see FIG. 9). The optical absorption layer in the sensor chip 10 may be composed of a type-II GaSb/InAs multi quantum well structure or a bulk material such as InGaAs, HgCdTe, InSb, InAsSb. A planar-type light receiving device that ensures independence of a plurality of pixels by means of selective diffusion may be used as the sensor chip. A mesa-type light receiving device that ensures independence of pixels by means of grooves may be also used as the sensor chip.

The read-out circuit (ROIC) is normally formed on a silicon (Si) substrate. For example, a CMOS device may be used as the read-out circuit. The sensor chip 10 is formed on a group semiconductor substrate, such as an InP substrate, or on a II-VI group semiconductor substrate, such as a ZnCdTe substrate. The read-out circuit 70 is formed on a Si substrate. Therefore, a combination of the sensor chip 10 and the read-out circuit 70 may be called a hybrid semiconductor. The read-out electrodes of the read-out circuit (CMOS device) 70 and the pixel electrodes of the sensor chip 10 are connected to each other via bumps 79 made of indium or the like.

Electric signals generated from respective pixels of the sensor chip 10 are read out by the read-out electrodes of the CMOS device 70. To take out output signals from the CMOS device 70, wires made of gold (Au) or aluminum (Al) are connected to output pins (not shown) on the package main body 62. For the wire bonding, pad electrodes 75 are formed on the CMOS device 70. As described above, light reflected from the top surface of the CMOS device 70 and the pad electrodes 75 is further reflected from the back surface of the window 61 and reaches the incidence surface of the sensor chip 10. When the light reflected from the top surface of the CMOS device 70 and the pad electrodes 75 is incident on the incidence surface of the sensor chip 10, nonuniformity in the sensitivity of the sensor chip 10 occurs in an image surface. Because a band-like pattern similar to the arrangement of the pad electrodes 75 on the CMOS device 70 appears on the image surface, light reflection at an edge portion of the CMOS device 70 extending off the sensor chip 10 is a significant cause of the nonuniformity described above. Additionally, since undulations of light and dark appear along short sides of the rectangular image surface, light reflection from the relay board 50 disposed under the CMOS device 70 and having an area extending off the sensor chip 10 also causes nonuniformity of sensitivity in the image surface.

Figure 2:
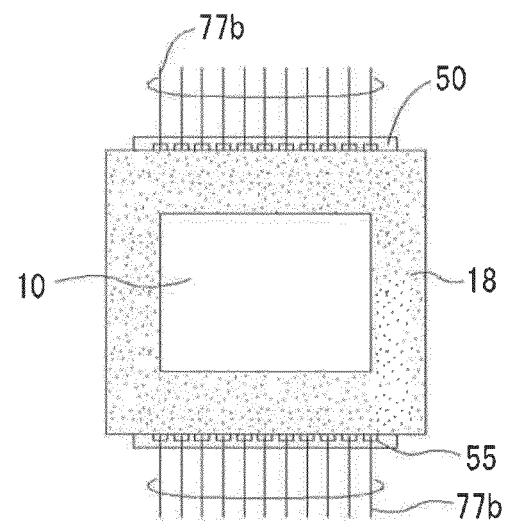
FIG. 2 is a plan view of a sensor chip and other components in FIG. 1 as viewed from a window.

In the infrared image sensor of the present embodiment, as illustrated in FIGS. 1 and 2, an edge of the sensor chip 10 is provided with a shielding plate 18. The shielding plate 18 is made of, for example, aluminum nitride (AlN). The shielding plate may include an AlN sintered member formed into the shape of combined flat plates. In addition, the shielding plate 18 may be a curved plate. AlN has high thermal conductivity and good heat dispersion properties. Therefore, temperature of the interior of the package is maintained at a low temperature by using the shielding plate 18 made of AlN. A part of the read-out circuit 70 extending off the sensor chip 10 in plan view is covered by the shielding plate 18. It is more preferable that not only the read-out circuit 70 but also the entire relay board 50 be covered. The shielding plate 18 is secured to the edge of the sensor chip 10 by means of an adhesive (fixing agent) 19. The shielding plate 18 extends like a canopy to cover the CMOS device (read-out circuit) 70 and the relay board 50. The shielding plate 18 is preferably provided along the entire perimeter of the sensor chip 10. The direction of inclination of the shielding plate 18 is important. When light passing through the window 61 reaches the shielding plate 18 and is reflected from the shielding plate 18, the sensitivity of the sensor chip 10 is affected if the reflected light enters into the center of the window 61, is further reflected from the back surface of the window 61, and enters into the sensor chip 10. Therefore, it is preferable that the shielding plate 18 is inclined such that the light reaching the shielding plate 18 is reflected from the shielding plate 18 in a direction away from the sensor chip 10. Specifically, the shielding plate 18 is inclined to be closer to the bottom of the package with increasing distance from the sensor chip. In this case, the sensitivity of the sensor chip 10 is not affected. That is, when the light reaching the shielding plate 18 is reflected in a direction away from the center of the window 61, the reflected light does not enter an effective pixel region D of the sensor chip 10. The shielding plate 18 is secured to the edge located apart from the effective pixel region D of the sensor chip 10.

Figure 3:
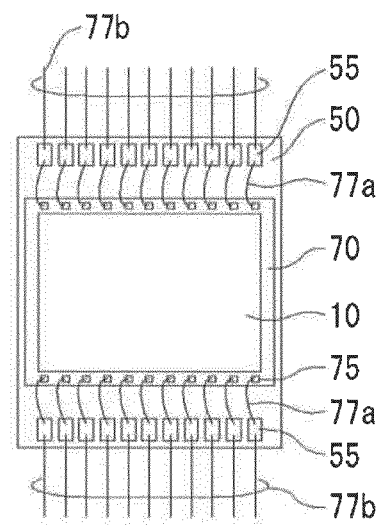
FIG. 3 is a plan view of the sensor chip and other components, with a shielding plate of FIG. 2 removed.

FIG. 3 is a plan view illustrating the sensor chip 10, the CMOS device 70, and the relay board 50, with the shielding plate 18 removed. Electrodes (pixel electrodes and ground electrodes) of the sensor chip 10 are flip-chip connected via indium bumps to electrodes (read-out electrodes and ground electrodes) of the CMOS device 70. To take out output signals, the CMOS device 70 is provided with the pad electrodes 75. The CMOS device 70 is connected via wires 77a to interconnection electrodes 55 on the relay board 50, and is further connected via wires 77b extending from the interconnection electrodes 55 to the output pins (not shown) on the package main body 62.

Figure 4:
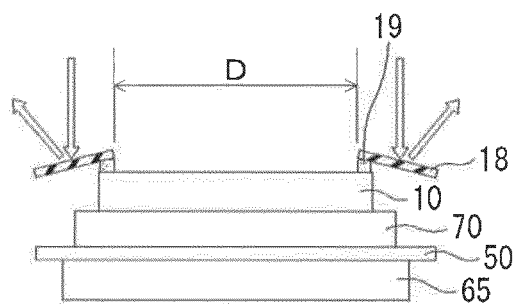
FIG. 4 illustrates how the shielding plate reflects light in the first embodiment.

FIG. 4 illustrates how incident light traveling off the effective pixel region D is reflected from the shielding plate 18. As described above, light incident outside the effective pixel region D is reflected from the shielding plate 18 in a direction away from the sensor chip 10, and thus does not affect the sensitivity of the sensor chip 10. That is, nonuniformity in the image surface (e.g., the image surface is locally illuminated with reflected light) does not occur, and uniform sensitivity may be achieved over the entire image surface.

Figure 5:
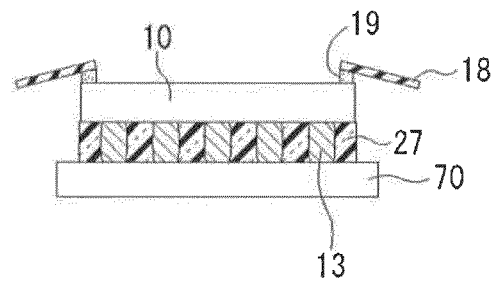
FIG. 5 illustrates an example of using an underfill resin for filling spaces between bumps for connecting the sensor chip to a read-out circuit and a resin serving as a fixing agent. The resin serving as the fixing agent is made of the same material as that of the underfill resin.

FIG. 5 is a diagram for explaining the fixing agent 19 for securing the shielding plate 18 to the edge of the sensor chip 10. Spaces between indium humps 13 for connecting the sensor chip 10 to the CMOS device 70 are filled with a sealing resin (underfill resin) 27. This is for the following reason. The sensor chip 10 is made of compound semiconductor, and the CMOS device 70 is made of silicon. Due to a difference in thermal expansion coefficient between the compound semiconductor and the silicon, thermal stress is generated at the interface between the sensor chip 10 and the CMOS device 70 when the image sensor is cooled by using the Peltier device 65. In addition, the image sensor is used for many years through many repeated cycles of a use state at low temperature and a non-use state at room temperature. The indium bumps 13 in an outer region tend to be peeled off by the thermal stress in cooling the image sensor. To prevent this, the spaces between the indium bumps 13 described above are filled with the underfill resin 27. The underfill resin 27 is made of, for example, polyimide resin. The polyimide resin is also used as the fixing agent 19 for securing the shielding plate 18. When the shielding plate 18 is secured by means of the same resin as the underfill resin 27 to the edge of the sensor chip 10, the same resin as that on the back surface (adjacent to the CMOS device 70) of the sensor chip 10 is applied to the front surface (adjacent to the fixing agent 19) of the sensor chip 10 to secure the shielding plate 18. Thus, since the resin having the same thermal expansion coefficient is applied to both the front and back surfaces of the sensor chip 10, the thermal stress between the back surface and the front surface of the sensor chip 10 may be reduced. This is preferable in improving reliability, such as durability, because the cooling and stopping of the infrared image sensor are repeated.

Second Embodiment

Figure 6:
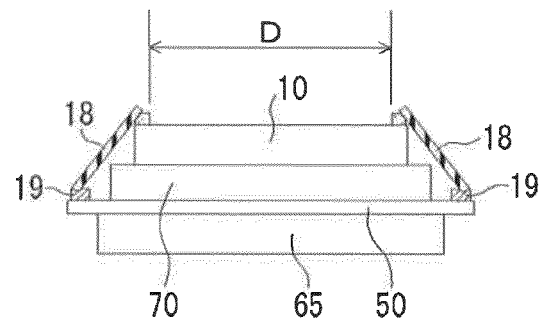
FIG. 6 illustrates a sensor chip, a read-out circuit, and a relay board according to a second embodiment.
Figure 7:
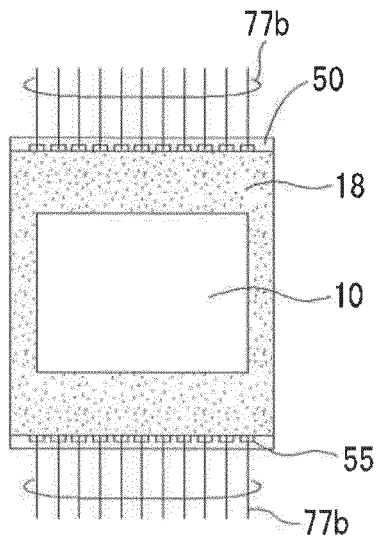
FIG. 7 is a plan view of the sensor chip, the read-out circuit, and the relay board illustrated in FIG. 6.

FIG. 6 is a diagram for explaining an infrared image sensor according to a second embodiment. In the present embodiment, the shielding plate 18 is secured by means of the fixing agent 19 along edges of the relay board 50 where the interconnection electrodes 55 of the relay board 50 are not arranged. The shielding plate 18 may be also secured to the edge of the sensor chip 10. In this embodiment, the shielding plate 18 is secured by using the same resin as the underfill resin 27 as a fixing agent 19, because the resin constituting the underfill resin 27 is resistant to peeling and has high durability. The shielding plate 18 is disposed over the wires 77a and 77b to cover them. FIG. 7 is a plan view of FIG. 6. The shielding plate 18 has a base on the relay board 50. Light traveling off the effective pixel region D is not reflected from the pad electrodes 75 on the CMOS device 70 and the back surface of the window 61 because the light is shielded with the shielding plate 18. In addition, the reflected light does not enter the effective pixel region D.

The infrared image sensor according to the present embodiment is preferable when, as illustrated in FIGS. 6 and 7, the pad electrodes 75 on the CMOS device (read-out circuit) 70 and the interconnection electrodes 55 on the relay board 50 are arranged along two opposite sides (long sides) of the rectangular CMOS device (read-out circuit) 70 and the relay board 50. Furthermore, the shielding plate 18 may be secured to an edge of the CMOS device (read-out circuit) 70 or an edge of the relay board 50. When the shielding plate 18 is secured to the CMOS device (read-out circuit) 70 or the relay board 50, the shielding plate 18 needs to be secured along the short sides where the pad electrodes 75 are not arranged, so as to avoid contact with wires for wire bonding. The shielding plate 18 is secured along the edges of the CMOS device (read-out circuit) 70 or the relay board 50, and is positioned to cover the area extending of the sensor chip.

EXAMPLE

Two test pieces of infrared image sensors including a test piece A1 and a test piece B1 were prepared to examine the uniformity of brightness in an image surface. The test piece A1 is the infrared image sensor 90 illustrated in FIG. 1. The test piece B1 is an infrared image sensor 190 illustrated in FIG. 8. The test piece A1 has the shielding plate 18. The test pieces B1 has the same structure as that of the test piece A1, except that the test piece B1 has no shielding plate. The test pieces A1 and D1 both include the sensor chip 10 and the read-out circuit (CMOS device) 70 illustrated in FIG. 9. As shown in FIG. 9, the sensor chip 10 has a stacked semiconductor layer disposed on an InP substrate 1. The stacked semiconductor layer includes a buffer layer 2, an optical absorption layer 3 having a type-II (InGaAs/GaAsSb) multi quantum well structure, an InGaAs intermediate layer 4, and an InP window layer 5. A plurality of p-type regions 6 are formed by the diffusion of zinc (Zn) introduced through openings of a selective diffusion mask pattern 36 on a surface of the InP window layer 5. A p-n junction 15 is formed at a diffusion front of Zn in the p-type region 6. The p-n junction is formed in an upper portion of the optical absorption layer 3. The concentration and diffusion depth of Zn impurity in the optical absorption layer 3 is controlled by adjusting the thickness of the InGaAs intermediate layer 4. Each of pixels is mainly formed in the extent of each p-type regions 6. The p-n junctions are separated from each other depending on the pixels. Therefore, adjacent pixels are separated by a non-selective diffusion region made of an n-type semiconductor, and thus are independent of each other. The read-out electrodes 71 of the read-out circuit (CMOS device) 70 and the pixel electrodes 11 of the sensor chip 10 are connected to each other via bumps 79. The sensor chip 10 is a so-called planar-type photodiode. The sensor chip 10 has a rectangular effective pixel region where 320 pixels are arranged along a long side and 256 pixels are arranged along a short side. An AR coating 35 is formed on a back surface of the InP substrate 1.

Figure 10:
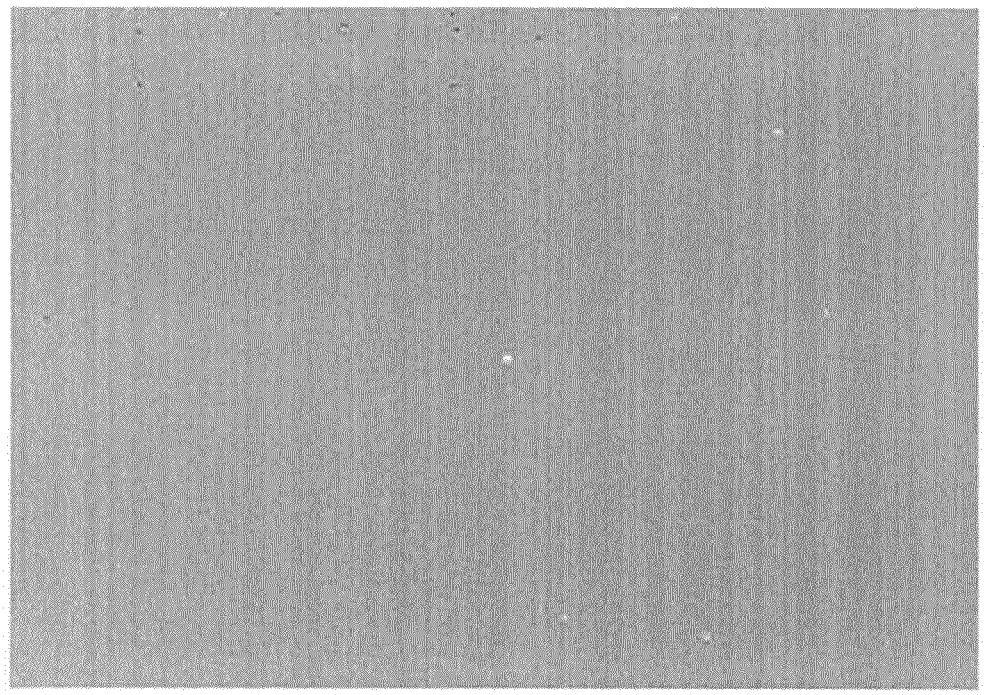
FIG. 10 illustrates an image for a test piece A1 according to an embodiment.
Figure 11:
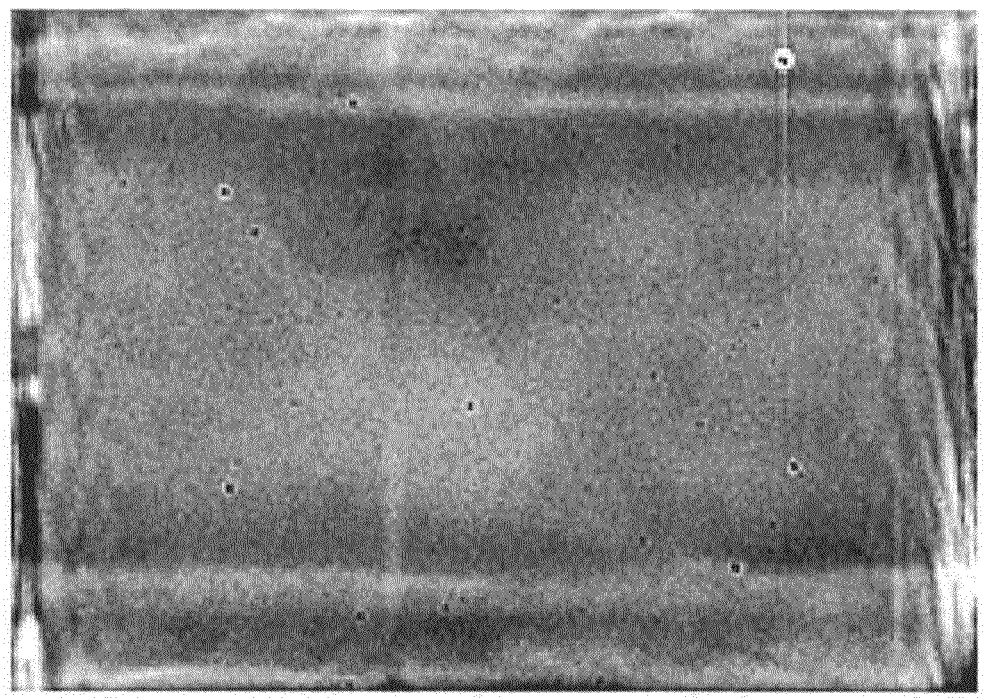
FIG. 11 illustrates an image for the test piece B1 (comparative example).

For each of test pieces A1 and B1, light of a halogen lamp was applied to a white flat plate and the reflected light was made incident on the window of the infrared image sensor. The resulting image was printed out to obtain a light intensity distribution. The result for the test piece A1 is shown in FIG. 10 and the result for the test piece B1 is shown in FIG. 11. Referring to FIG. 11, in the test piece B1, a white band and dark portions along upper and lower edges of the white band appear near and along each of two long sides. Also, irregularly undulating light and dark patterns appear neat short sides.

Figure 8:
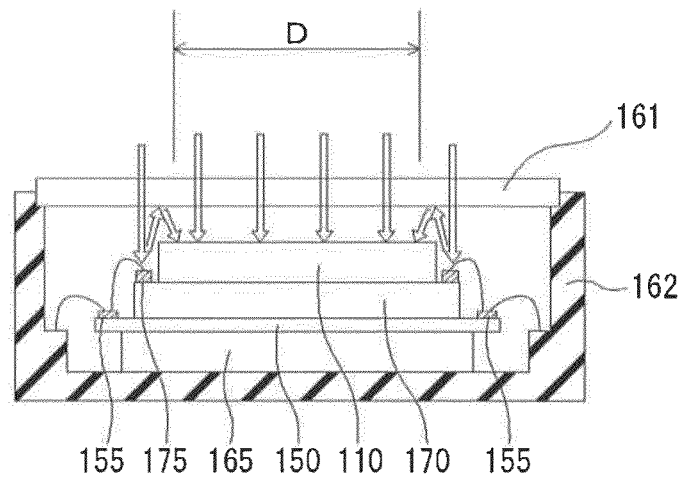
FIG. 8 illustrates a test piece B1 in Example (comparative example).
Figure 9:
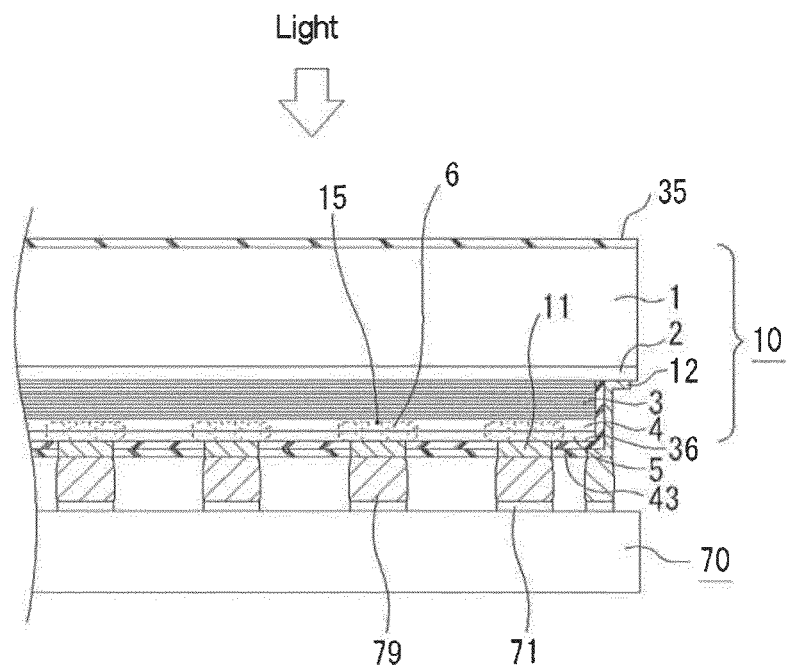
FIG. 9 illustrates a sensor chip and a read-out circuit in Example.

In the test piece B1, that is, in the infrared image sensor 190 illustrated in FIG. 8, a read-out circuit (CMOS device) 170 has an area extending off a sensor chip 110, and pad electrodes 175 are arranged in this area. Light traveling off the effective pixel region D is reflected from this area, reaches and reflected from the back surface of a window 161, and enters the effective pixel region D of the sensor chip 110. A relay board 150 also has an area extending off the sensor chip 110 and the CMOS device 170, and interconnection electrodes 155 are arranged in this area. However, along the short sides of the image, the pad electrodes 175 and the interconnection electrodes 155 are not arranged on the CMOS device 170 and the relay board 150. This means that the electrodes are unlikely to contribute to the phenomenon of irregularly undulating light and dark portions along the short sides of the image. The reflected light from the extending area of the CMOS device 170 and that from the extending area of the relay board 150 may interfere with each other.

In the test piece A1, as illustrated in FIG. 10, the light intensity distribution is uniform and there is no intensity nonuniformity. The test piece A1 has the shielding plate 18 as illustrated in FIG. 1. Therefore, light traveling off the effective pixel region D is reflected from the shielding plate 18 in a direction away from the central region of the sensor chip 10. The reflected light does not enter the effective pixel region D of the sensor chip 10, and neither the local nonuniformity of light intensity nor the global gradient of light intensity occurs.

The present invention is not limited to specific configurations disclosed in the embodiments.

What is claimed is:

1. An image sensor comprising:
   a package having a window;
   a sensor chip facing the window, the sensor chip having a pixel region;
   a read-out circuit disposed farther from the window than the sensor chip, the read-out circuit being electrically connected to the sensor chip; and
   a shielding plate disposed outside the pixel region of the sensor chip, wherein the shielding plate is configured to block transmission of light, and the shielding plate is inclined to be closer to a bottom of the package with increasing distance from the sensor chip, the bottom of the package being located at the opposite side of the window.

2. The image sensor according to claim 1, wherein the shielding plate extends to outside of the read-out circuit in plan view.

3. The image sensor according to claim 1, wherein the shielding plate is secured to an edge of the sensor chip.

4. The image sensor according to claim 1, further comprising a relay board disposed under the read-out circuit,
wherein the read-out circuit includes a pad electrode at an area extending from the sensor chip,
the relay board includes an interconnection electrode at an area extending from the sensor chip, and
the shielding plate is secured to an edge of the read-out circuit or an edge of the relay board.

5. The image sensor according to claim 1, wherein the shielding plate is made of aluminum nitride.

6. The image sensor according to claim 1, further comprising:
bumps electrically connecting the sensor chip to the read-out circuit, and
an underfill resin filling spaces between the bumps, wherein
the shielding plate is secured by means of a resin serving as a fixing agent, and
the resin is made of the same material as that of the underfill resin.

7. An image sensor comprising:
a package having a window;
a sensor chip facing the window, the sensor chip having a pixel region;
a read-out circuit disposed farther from the window than the sensor chip, the read-out circuit being electrically connected to the sensor chip; and
a shielding plate disposed outside the pixel region of the sensor chip, wherein
the shielding plate is configured to block transmission of light, and
the shielding plate is secured to an edge of the sensor chip.

8. The image sensor according to claim 7, wherein the shielding plate extends to outside of the read-out circuit in plan view.

9. The image sensor according to claim 7, wherein the shielding plate is inclined to reflect light entering through the window in a direction away from the sensor chip.

10. The image sensor according to claim 7, wherein the shielding plate is inclined to be closer to a bottom of the package with increasing distance from the sensor chip, the bottom of the package being located at the opposite side of the window.

11. The image sensor according to claim 7, further comprising a relay board disposed under the read-out circuit, wherein
the read-out circuit includes a pad electrode at an area extending from the sensor chip,
the relay board includes an interconnection electrode at an area extending from the sensor chip, and
the shielding plate is secured to an edge of the read-out circuit or an edge of the relay board.

12. The image sensor according to claim 7, wherein the shielding plate is made of aluminum nitride.

13. The image sensor according to claim 7, further comprising:
bumps electrically connecting the sensor chip to the read-out circuit, and
an underfill resin filling spaces between the bumps, wherein
the shielding plate is secured by means of a resin serving as a fixing agent, and
the resin is made of the same material as that of the underfill resin.

* * * * *